(12) United States Patent
Matsumoto et al.

(10) Patent No.: US 8,148,300 B2
(45) Date of Patent: Apr. 3, 2012

(54) SUPERCONDUCTING FILM AND METHOD OF MANUFACTURING THE SAME

(75) Inventors: Kaname Matsumoto, Takatsuki (JP); Masashi Mukaida, Atsugi (JP); Yutaka Yoshida, Nagoya (JP); Ataru Ichinose, Kawasaki (JP); Shigeru Horii, Tokyo (JP)

(73) Assignees: Japan Science and Technology Agency, Saitama (JP); Central Research Institute of Electric Power Industry, Tokyo (JP)

( * ) Notice: Subject to any disclaimer, the term of this patent is extended or adjusted under 35 U.S.C. 154(b) by 0 days.

(21) Appl. No.: 12/662,741

(22) Filed: Apr. 30, 2010

(65) Prior Publication Data

US 2010/0267568 A1 Oct. 21, 2010

Related U.S. Application Data

(62) Division of application No. 10/569,801, filed as application No. PCT/JP2004/012781 on Aug. 27, 2004, now Pat. No. 7,772,157.

(30) Foreign Application Priority Data

Aug. 29, 2003 (JP) ................................. 2003-308020

(51) Int. Cl.
 *H01L 39/24* (2006.01)
(52) U.S. Cl. .................. 505/100; 505/477; 505/816
(58) Field of Classification Search .................. 505/100, 505/235–239, 475, 477, 816
 See application file for complete search history.

(56) References Cited

U.S. PATENT DOCUMENTS 4,101,731 A * 7/1978 Marancik .................... 174/125.1
(Continued)

FOREIGN PATENT DOCUMENTS

JP 63-318014 12/1988
(Continued)

OTHER PUBLICATIONS

Dam, B.; "Contorlling the Natural Strong Pinning Sites in Laser Ablated YBCO Thin Films". Physikcs C 341-384 (200) 2327-2330.*

(Continued)

*Primary Examiner* — Stuart Hendrickson
*Assistant Examiner* — Richard M Rump
(74) *Attorney, Agent, or Firm* — Finnegan, Henderson, Farabow, Garrett & Dunner, LLP (57) ABSTRACT

The present invention relates to a superconducting film having a substrate and a superconductor layer formed on the substrate, in which nano grooves are formed parallel to a current flowing direction on a substrate surface on which the superconductor layer is formed and two-dimensional crystal defects are introduced in the superconductor layer on the nano grooves, and a method of manufacturing this superconducting film. A superconducting film of the invention, which is obtained at low cost and has very high Jc, is useful in applications such as cables, magnets, shields, current limiters, microwave devices, and semifinished products of these articles.

18 Claims, 6 Drawing Sheets

U.S. PATENT DOCUMENTS

| | | | |
|---|---|---|---|
| 5,001,108 A * | 3/1991 | Taguchi | 505/191 |
| 5,498,881 A * | 3/1996 | Fujimoto et al. | 257/35 |
| 6,207,067 B1 * | 3/2001 | Yutani et al. | 505/413 |
| 6,605,225 B1 * | 8/2003 | Yamashita et al. | 216/3 |
| 6,667,492 B1 | 12/2003 | Kendall | |
| 2002/0082171 A1 | 6/2002 | Schoop et al. | |
| 2003/0020060 A1 * | 1/2003 | Iwasaki et al. | 257/13 |
| 2003/0073584 A1 | 4/2003 | Akasegawa et al. | |
| 2004/0235670 A1 * | 11/2004 | Crisan et al. | 505/100 |
| 2005/0237462 A1 * | 10/2005 | Nguyen et al. | 349/130 |

FOREIGN PATENT DOCUMENTS

| | | |
|---|---|---|
| JP | 04-114996 | 4/1992 |
| JP | 05-148084 | 6/1993 |
| JP | 05-267726 | 10/1993 |
| JP | 09-310161 | 12/1997 |
| JP | 3049125 | 3/1998 |
| JP | 2000-095518 | 4/2000 |
| JP | 2001-162600 | 6/2001 |
| JP | 2003-008090 | 1/2003 |

OTHER PUBLICATIONS

Baert, M. et al., "Composite Flux-Line Lattices Stablized in Superconducting Films by a Regular Array of Artificial Defects", Physical Review Letters, vol. 74, No. 16, Apr. 17, 1995.

Crisan, A., "Sputtered nanodots: A costless method for inducing effective pinning centers in superconducting thin films", Applied Physics Letters, vol. 79, No. 27, Dec. 31, 2001.

Dam, B. et al., Controlling the natural strong pinning sites in laser ablated YBa2CU3O7-6 thin films, Physica C341-348, pp. 22327-2330, (2000).

Dam, B. et al., "Origin of high critical currents in Yba2CU3O7-6 superconducting thin films," Nature, vol. 399, pp. 439-442, (1999).

Japanese Office Action mailed Jul. 24, 2009 in counterpart Japanese Application No. 2003-308020.

Lin, J. Y. et al. "Flux pinning in YBa2CU3O7-6 thin films with ordered arrays of columnar defects," Physical Review B, vol. 54, No. 18, pp. 717-720, Nov. 1, 1996.

USPTO Advisory Office Action, U.S. Appl. No. 10/569,801, mailed Jul. 10, 2009.

USPTO Office Action, U.S. Appl. No. 10/569,801, mailed Apr. 17, 2009.

USPTO Office Action, U.S. Appl. No. 10/569,801, mailed Dec. 18, 2008.

European Search Report mailed Oct. 5, 2011 in corresponding European Patent Application No. 04772730.0 (3 pages).

Hiroshi, Yamada et al.: "Periodic Artifical Pinning Centers for High Critical Current Density of Tape Conductor", IEEE Transactions on Applied Superconductivity, IEEE Service Center, Los Alamitos, CA, US, vol. 12, No. 1, Mar. 1, 2002, pp. 1113-1116, XP011069081, ISSN: 1501-8223.

Jia C. L. et al. "The microstructure of epitaxial YB2Cu3O7 films on steep steps in LaAlO3 substrates" Physica C, North-Holland Publishing, Amsterdam, NL, vol. 196, No. 3—Jun. 20, 1992, pp. 211-226, XP022729448 ISSN: 0921-4534, DOI: 10.1016/0921-4534(92)90438-I [retrieved on Jun. 20, 1992].

* cited by examiner

SUPERCONDUCTING FILM AND METHOD OF MANUFACTURING THE SAME

CROSS-REFERENCE TO RELATED APPLICATIONS

This is a Divisional of allowed application Ser. No. 10/569,801, filed on Feb. 27, 2006 now U.S. Pat. No. 7,772,157, which claims priority to PCT/JP2004/012781, filed Aug. 27, 2004 and Japanese Application No. 2003-308020, filed Aug. 29, 2003. All of the applications are incorporated herein by reference in their entirety.

TECHNICAL FIELD

The present invention relates to superconducting thin and thick films having a high critical current density in a magnetic field which can be used in the filed of cables, magnets, shields, current limiters, microwave devices, semifinished products of these articles and the like and a method of manufacturing the films.

BACKGROUND ART

When a magnetic field of not less than a lower critical magnetic field $H_{c1}$ is applied to a superconductor, quantized flux lines ($\phi_0 = 2.07 \times 10^{-15}$ Wb) are formed and penetrate into the superconductor. When a current is caused to flow in this state, the Lorentz force acts on the quantized flux lines. When these quantized flux lines begin to move, a voltage is generated and the superconducting state is broken. It is known that, for example, in a superconducting film formed from a high-temperature oxide superconductor $YBa_2Cu_3O_{7-x}$(YBCO), dot-like defects such as naturally introduced oxygen deficiency and fine Impurities function as pinning centers of quantized flux lines. Furthermore, it is known that one-dimensional defects such as dislocations and two-dimensional defects such as crystal grain boundaries function also as pinning centers. In this case of YBCO, it is important that these crystal defects be present perpendicular to the film plane. In general, YBCO-based high temperature superconductors are materials which have high crystal anisotropy and, therefore, when a magnetic field is applied parallel to the c-axis of a crystal, Jc tends to decrease greatly compared to a case where a magnetic field is applied perpendicularly to the c-axis. A usually used YBCO thin film is formed so that the c-axis is perpendicular to the film plane (surface), and, therefore, Jc decreases greatly when a magnetic field is applied perpendicularly to the film plane (surface). When a superconducting tape fabricated from a YBCO thin film is used to form a coil, magnetic field components of low Jc parallel to the c-axis govern coil properties, since a parallel magnetic field and a perpendicular magnetic field are applied to the tape. However, when one-dimensional defects or crystal grain boundaries are present in a direction parallel to the c-axis, they become pinning centers of quantized flux lines and Jc in this direction is improved. Therefore, the crystal orientation of one-dimensional defects or crystal grain boundaries is very important for improvement in coil properties. In contrast, this does not apply to dot-like defects etc. since they are isotropic.

The relationship between the dislocation density in a YBCO film and Jc has been reported by Dam (see B. Dam et al., Nature, Vol. 399, p 439, 1999). According to the report, dislocation densities of 10 $\mu m^{-2}$ to 100 $\mu m^{-2}$ can be obtained by changing film forming conditions in various ways and Jc increases with increasing dislocation density, although it is difficult to control the density per unit area of dislocations which are naturally introduced during film growth.

Crystal grain boundaries function not only as pinning centers, but also as barriers of superconducting currents. In fact, in a high temperature superconducting film of YBCO etc., Jc is very small in a grain boundary having a large inclination (the angle of a grain boundary to a normal line of the ab-plane of YBCO), but large Jc is maintained when the inclination is low. A low angle grain boundary can be regarded as a dislocation array. Although a dislocation is an insulator (non-superconductor), in a low angle grain boundary having a large spacing between dislocations, a strongly-coupled superconducting part exists between dislocations and a large superconducting current flows through the low angle grain boundary. However, when the inclination increases and the strains of dislocations begin to overlap, the current becomes less likely to flow. If boundary planes are parallel to a current flowing direction, they become very effective pinning centers. In general, however, boundary planes exist randomly, it is difficult to control Jc by controlling the inclination of boundary planes.

On the other hand, fine precipitates having a size close to the coherent length of the superconductor are also effective as pinning centers. Furthermore, artificial defects introduced by lithography and columnar crystal defects introduced by electron beam irradiation and heavy ion irradiation also become pinning centers. There is a possibility that desired pinning centers can be introduced by lithography in a film.

In a case where electron beam exposure is used, there is a report that the pin diameter can be decreased to the order of 10 to 20 nm, although it has not been able to reduce the pin diameter to the nano level. Also, the pin spacing can be adjusted to the same extent. Examples of measurement experiment of critical currents show that some peaks appear in superconducting properties in magnetic field depending on the relationship between quantized flux lines and pin arrangement (see J. Y. Lin et al., Phys. Rev. B54, R12712, 1996). Although this method is effective in artificial pin introduction, from a practical viewpoint, the throughput is low and the cost is too high for a large area fabrication and for wire fabrication. In heavy ion irradiation and the like, columnar defects are formed in superconducting crystals and this is effective in improving Jc. However, the equipment cost and the cost of ion acceleration are very high. Furthermore, in some cases materials are radioactivated and hence these methods are not practical.

In order to introduce crystal defects such as dislocations in a film, there is also available a method by which island-like crystals such as nano dots are formed on a substrate surface and a superconducting film is formed on the island-like crystals. There is an exemplary report that, in this case, Jc is improved by forming nano dots of Ag on a substrate (see A. Crisan et al., Appl. Phys. Lett., Vol. 79, p 4547, 2001). A literature of Dam suggests a principle that when fine precipitates exist in the process of growth of a film on a substrate, the continuity of film growth is lost on the fine precipitates, resulting in crystal defects, dislocations and grain boundaries (see B. Dam et al., Physica C341-348, p 2327, 2000). According to these techniques, however, the arrangement of introduced defects is random and the pinning force is averaged. Therefore, these techniques have their limits in drastically improving Jc.

DISCLOSURE OF THE INVENTION

An object of the present invention is to provide a structure of ideal pinning centers in a superconducting film which is formed on a substrate and a method of introducing the pinning centers. Another object of the invention is to provide, at low cost, a technique for increasing Jc which can be applied to all Type II superconductors of film shape.

A superconducting film of the first embodiment of the invention has a substrate and a superconductor layer formed on the substrate, in which nano grooves are formed parallel to a current flowing direction on a substrate surface on which the superconductor layer is formed and two-dimensional crystal defects are introduced in the superconductor layer on the nano grooves. Each of the two-dimensional crystal defects may be continuous in a current flowing direction, it may be an array of discontinuous two-dimensional crystal defects, or it may be irregularly distributed on the substrate. The two-dimensional crystal defects may be crystal grain boundaries, dislocation arrays, amorphous bodies formed from elements constituting the superconductor layer, nonsuperconductors or low critical temperature superconductors. Preferably, the nano grooves may have a width of not more than 100 nm and a depth of not more than 100 nm and the average center to center distance of the adjacent nano grooves in a direction perpendicular to a current flowing direction may be not more than 500 nm. The substrate may be a substrate of an oxide having a perovskite type crystal structure, a rock-salt type crystal structure, a spinel type crystal structure, an yttrium stabilized zirconia type structure, a fluorite type crystal structure, a rare earth C type crystal structure, a pyrochlore type crystal structure, and the like. Alternatively, the substrate may be an oxide substrate, a nitride substrate, a semiconductor substrate, a nickel-based alloy substrate, a copper-based alloy substrate or an iron-based alloy substrate on the surface of which a buffer layer made of the above-cited oxide or a boride is formed. The superconductor layer may be formed from a superconducting material selected from the group consisting of copper oxide-based high temperature superconducting materials having a chemical formula of $LnBa_2Cu_3O_{7+x}$ where, Ln is one or more elements selected from the group consisting of Y element and rare earth elements and $-0.5<x<0.2$; copper oxide-based high temperature superconducting materials having a chemical formula of $(Bi_{1-x}Pb_x)_2Sr_2Ca_{n-1}Cu_nO_{2n+4+y}$, where $0<x<0.4$, $-0.5<y<0.5$ and $n=1, 2$ or 3; and superconducting materials which contain $MgB_2$ as a main component. Also, the superconductor layer may be formed from a plurality of layers and nano grooves may be formed in each of the plurality of layers except a top layer.

A superconducting film of the second embodiment of the invention has a substrate and a superconductor layer formed on the substrate, in which nano grooves are formed parallel to a current flowing direction on a substrate surface on which the superconductor layer is formed, defect inducing parts are formed on the nano grooves, and the two-dimensional crystal defects are introduced in the superconductor layer on the defect inducing parts. Each of the two-dimensional crystal defects may be continuous in a current flowing direction, it may be an array of discontinuous two-dimensional crystal defects, or it may be irregularly distributed on the substrate. The two-dimensional crystal defects may be crystal grain boundaries, dislocation arrays, amorphous bodies formed from elements constituting the superconductor layer, nonsuperconductors or low critical temperature superconductors. Preferably, the nano grooves may have a width of not more than 100 nm and a depth of not more than 100 nm and the center to center distance of the adjacent nano grooves in a direction perpendicular to a current flowing direction may be not more than 500 nm. The substrate may be a substrate of an oxide having a perovskite type crystal structure, a rock-salt type crystal structure, a spinel type crystal structure, an yttrium stabilized zirconia type structure, a fluorite type crystal structure, a rare earth C type crystal structure, a pyrochlore type crystal structure. Alternatively, the substrate may be an oxide substrate, a nitride substrate, a semiconductor substrate, a nickel-based alloy substrate, a copper-based alloy substrate or an iron-based alloy substrate on the surface of which a buffer layer made of the above-cited oxide or a boride is formed. The superconductor layer may be formed from a superconducting material selected from the group consisting of copper oxide-based high temperature superconducting materials having a chemical formula of $LnBa_2Cu_3O_{7+x}$, where Ln is one or more elements selected from the group consisting of Y element and rare earth elements and $-0.5<x<0.2$; copper oxide-based high temperature superconducting materials having a chemical formula of $(Bi_{1-x}Pb_x)_2Sr_2Ca_{n-1}Cu_nO_{2n+4+y}$, where $0<x<0.4$, $-0.5<y<0.5$ and $n=1, 2$ or 3; and superconducting materials which contain $MgB_2$ as a main component. The defect inducing parts may be formed from a metal, an intermetallic compound, a nitride or an oxide. Also, the superconductor layer may be formed from a plurality of layers and nano grooves may be formed in each of the plurality of layers except a top layer.

A superconducting film of the third embodiment of the invention has a substrate and a superconductor layer formed on the substrate, in which rows of nano holes are formed parallel to a current flowing direction on a substrate surface on which the superconductor layer is formed and rows of one-dimensional crystal defects are introduced in the superconductor layer on the nano holes. Each of the rows of one-dimensional crystal defects may be a row of one-dimensional crystal defects which is continuous in a current flowing direction, it may be an array of discontinuous row of one-dimensional crystal defects, or it may be irregularly distributed on the substrate. The one-dimensional crystal defects may be crystal grain boundaries, dislocation arrays, amorphous bodies formed from elements constituting the superconductor layer, nonsuperconductors or low critical temperature superconductors. Preferably, the nano holes may have a diameter of not more than 100 nm and the center to center distance of the adjacent nano holes in a direction perpendicular to a current flowing direction may be not more than 500 nm. The substrate may be a substrate of an oxide having a perovskite type crystal structure, a rock-salt type crystal structure, a spinel type crystal structure, an yttrium stabilized zirconia type structure, a fluorite type crystal structure, a rare earth C type crystal structure, a pyrochlore type crystal structure. Alternatively, the substrate may be an oxide substrate, a nitride substrate, a semiconductor substrate, a nickel-based alloy substrate, a copper-based alloy substrate or an iron-based alloy substrate on the surface of which a buffer layer made of the above-cited oxide or a boride is formed. The superconductor layer may be formed from a superconducting material selected from the group consisting of copper oxide-based high temperature superconducting materials having a chemical formula of $LnBa_2Cu_3O_{7+x}$, where Ln is one or more elements selected from the group consisting of Y element and rare earth elements and $-0.5<x<0.2$; copper oxide-based high temperature superconducting materials having a chemical formula of $(Bi_{1-x}Pb_x)_2Sr_2Ca_{n-1}Cu_nO_{2n+4+y}$, where $0<x<0.4$, $-0.5<y<0.5$ and $n=1, 2$ or 3; and superconducting materials which contain $MgB_2$ as a main component. Also, the superconductor layer may be formed from a plurality of layers and nano holes may be formed in each of the plurality of layers except a top layer.

A superconducting film of the fourth embodiment of the invention has a substrate and a superconductor layer formed on the substrate, in which rows of nano holes are formed parallel to a current flowing direction on a substrate surface on which the superconductor layer is formed, defect inducing parts are formed on the nano holes, and rows of one-dimensional crystal defects are introduced in the superconductor layer on the defect inducing parts. Each of the rows of one-dimensional crystal defects may be a row of one-dimensional crystal defects which is continuous in a current flowing direction, it may be an array of discontinuous row of one-dimensional crystal defects, or it may be irregularly distributed on the substrate. The one-dimensional crystal defects may be crystal grain boundaries, dislocation arrays, amorphous bodies formed from elements constituting the superconductor layer, nonsuperconductors or low critical temperature superconductors. Preferably, the nano holes may have a diameter of not more than 100 nm and the average center to center distance of the adjacent nano holes in a direction perpendicular to a current flowing direction may be not more than 500 nm. The substrate may be a substrate of an oxide having a perovskite type crystal structure, a rock-salt type crystal structure, a spinel type crystal structure, an yttrium stabilized zirconia type structure, a fluorite type crystal structure, a rare earth C type crystal structure, a pyrochlore type crystal structure. Alternatively the substrate may be an oxide substrate, a nitride substrate, a semiconductor substrate, a nickel-based alloy substrate, a copper-based alloy substrate or an iron-based alloy substrate on the surface of which a buffer layer made of the above-cited oxide or a boride is formed. The superconductor layer may be formed from a superconducting material selected from the group consisting of copper oxide-based high temperature superconducting materials having a chemical formula of $LnBa_2Cu_3O_{7+x}$, where Ln is one or more elements selected from the group consisting of Y element and rare earth elements and $-0.5<x<0.2$; copper oxide-based high temperature superconducting materials having a chemical formula of $(Bi_{1-x}Pb_x)_2Sr_2Ca_{n-1}Cu_nO_{2n+4+y}$, where $0<x<0.4$, $-0.5<y<0.5$ and n=1, 2 or 3; and superconducting materials which contain $MgB_2$ as a main component. The defect inducing parts may be formed from a metal, an intermetallic compound, a nitride or an oxide. Also, the superconductor layer may be formed from a plurality of layers and nano holes may be formed in each of the plurality of layers except a top layer.

Superconducting films of the first and second embodiments of the invention can be manufactured by a method comprising the steps of forming nano grooves on a substrate, optionally forming defect inducing parts on the nano grooves, and growing a superconductor layer on the substrate. The step of forming nano grooves may be performed by mechanical polishing, etching, nano imprint, AFM in processing mode or nano lithography. Preferably, the nano grooves may be formed in such a manner that the nano grooves have a width of not more than 100 nm and a depth of not more than 100 nm and the average center to center distance of the adjacent nano grooves in a direction perpendicular to a current flowing direction is not more than 500 nm. On the other hand, the step of forming a superconductor layer may be performed by PLD, evaporation, sputtering, CVD, MBE or MOD process. Furthermore, the step of forming defect inducing parts may be performed by PLD, evaporation, sputtering, CVD or MBE process.

Superconducting films of the third and fourth embodiments of the invention can be manufactured by a method comprising the steps of forming rows of nano holes on a substrate, optionally forming defect inducing parts on the nano holes, and growing a superconductor layer on the substrate. The step of forming rows of nano holes may be performed by mechanical polishing, etching, nano imprint, atomic force microscopy (AFM) in processing mode or nano lithography. Preferably, the nano holes may be formed in such a manner that the nano holes have a diameter of not more than 100 nm and the average center to center distance of the adjacent rows of nano holes in a direction perpendicular to a current flowing direction is not more than 500 nm. On the other hand, the step of forming a superconductor layer may be performed by pulsed laser deposition (PLD), evaporation, sputtering, chemical vapor deposition (CVD), molecular beam epitaxy (MBE) or metal-organic deposition (MOD) process. Furthermore, the step of forming defect inducing parts may be performed by PLD, evaporation, sputtering, CVD or MBE process.

According to the present invention configured as described above, strong pinning centers having excellent pinning efficiency can be introduced into a superconducting film, and a superconducting film having very high Jc can be manufactured at low cost. Since the pinning centers introduced into a superconducting film of the invention are aligned in a current flowing direction, these pinning centers will not impede a current flowing path. Therefore, a superconducting film of the invention is useful in applications which require flowing large currents, such as cables, magnets, shields, current limiters, microwave devices, and semifinished products of these articles.

The above and other objects, effects, features and advantages of the present invention will become more apparent from the following description of the embodiments thereof taken in conjunction with the accompanying drawings.

BEST MODE FOR CARRYING OUT THE INVENTION

Figure 1:
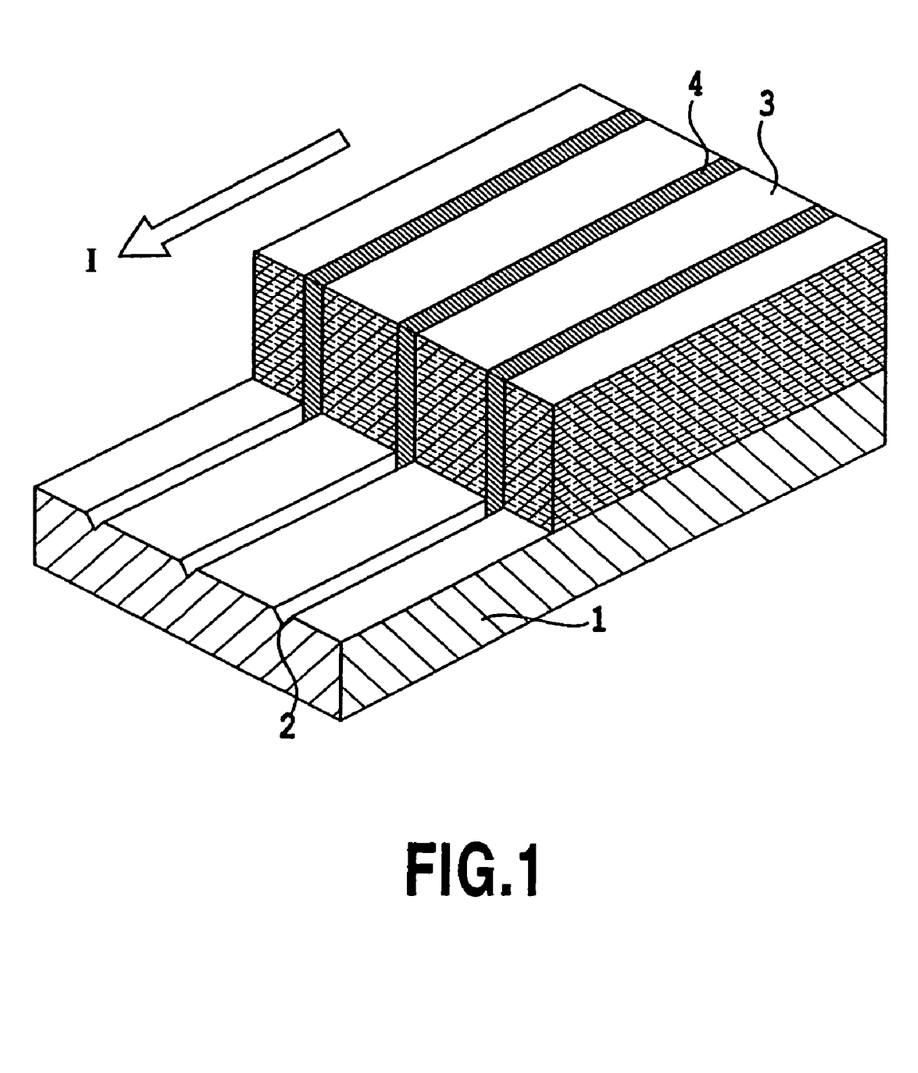
FIG. 1 is a sectional view, in perspective, of a superconducting film of the first embodiment of the invention.

A superconducting film of the first embodiment of the invention is shown in FIG. 1. The superconducting film of FIG. 1 has a substrate 1 and a superconductor layer 3 formed on the substrate 1. Nano grooves 2 are formed parallel to a current flowing direction on a substrate surface where the superconductor layer 3 is formed, and two-dimensional crystal defects 4 are introduced in the superconductor layer on the nano grooves 2. The two-dimensional crystal defects 4 function as two-dimensional pinning centers.

As the substrate 1 may be used a substrate of an oxide having perovskite type crystals, such as $SrTiO_3$ and $LaAlO_3$; rock-salt type crystals, such as MgO and NiO; spinel type crystals, such as $MgAl_2O_4$; yttrium stabilized zirconia; fluorite type crystals, such as $CeO_2$; rare earth C type crystals; and pyrochlore type crystals. Alternatively, substrates with a buffer layer may be used as the substrate 1: wherein the substrates on which the buffer layer is formed may be a substrate of the above oxides, a nitride substrate, a semiconductor substrate, a substrate of pure nickel, a nickel-based alloy substrate of Ni—Cr, Ni—W and the like, a substrate of pure copper, a copper-based alloy substrate of Cu—Ni and the like, or an iron-based alloy substrate of Fe—Si, stainless steel and the like; and wherein the buffer layer, which is formed on the surface of the substrate, may be made of the above-cited oxide or a boride ($MgB_2$ etc.). By using such substrates, it becomes possible to form a superconductor layer 3 comprising a superconductor which is c-axis oriented on the surface of the substrate 1.

The nano grooves 2 are a plurality of grooves formed in the substrate 1, and have a width of not more than 100 nm, and preferably 5 nm to 50 nm, and a depth of not more than 100 nm, and preferably 5 nm to 50 nm. It is desirable that the width of the nano grooves be larger than the diameter of quantized flux lines (twice the coherent length E of the superconducting material), depending on the superconducting material constituting the superconductor layer 3. It is desirable that the average center to center distance of the plurality of nano grooves in a direction perpendicular to a current flowing direction be smaller than the lattice constant of quantized flux line lattice $a_f$ ($=1.07 \times (f_0/B)^{1/2}$, B denotes a magnetic field applied to the superconductor layer 3). The average center to center distance of the nano grooves is usually not more than 500 nm, preferably 15 nm to 300 nm, and more preferably 20 nm to 200 nm, depending on applied magnetic field B. When the nano grooves have widths, depths and average center to center distances in the above-described ranges, the quantized flux lines in the superconductor layer can be efficiently pinned.

Figure 5A:
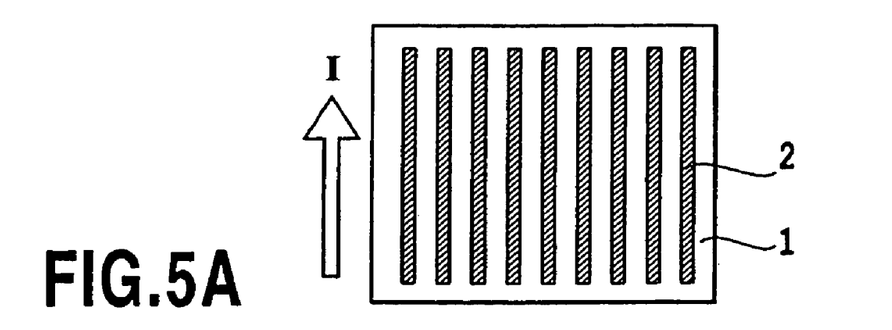
FIG. 5A is a schematic top view of an example of the arrangement of nano grooves in a superconducting film of the invention in which the nano grooves are continuous.
Figure 5B:
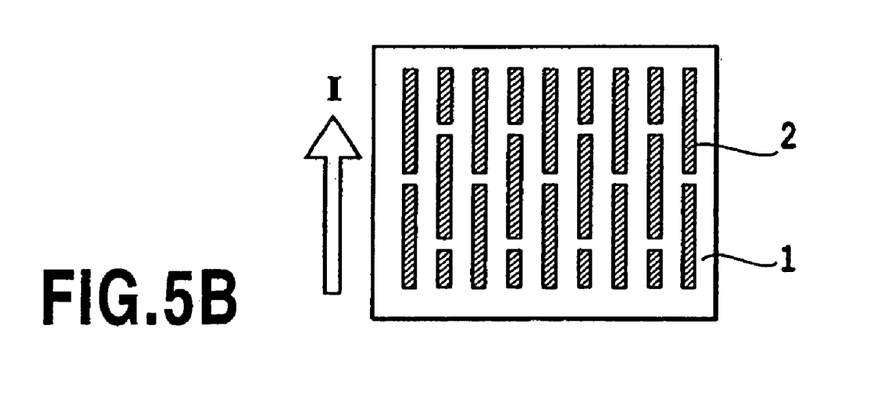
FIG. 5B is a schematic top view of an example of the arrangement of nano grooves in a superconducting film of the invention in which the nano grooves are discontinuous.
Figure 5C:
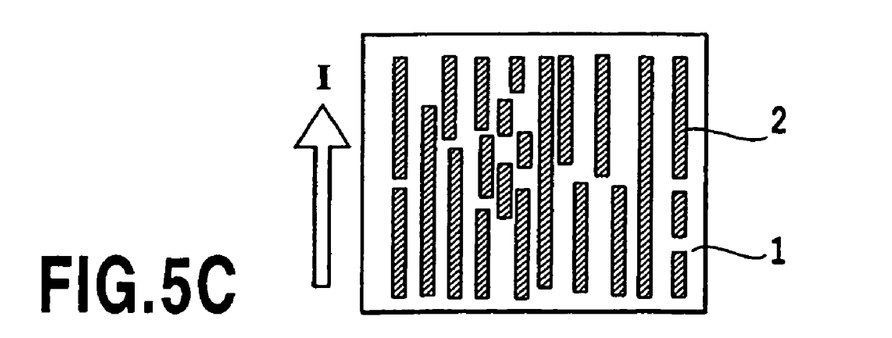
FIG. 5C is a schematic top view of an example of the arrangement of nano grooves in a superconducting film of the invention in which the nano grooves are irregularly arranged.

Each of the nano grooves 2 may be continuous in the current flowing direction of the superconducting film (see FIG. 5A) or may be an array of discontinuous grooves (see FIG. 5B). It is desirable that the distance between two nano grooves in a discontinuous part in a current flowing direction be smaller than the lattice constant of quantized flux line lattice $a_f$ in the superconductor layer 3. This distance is usually not more than 500 nm, preferably 15 nm to 300 nm, and more preferably 20 nm to 200 nm, depending on a magnetic field B applied to the superconductor layer 3. Alternatively, the plurality of nano grooves 2 may be irregularly arranged on the substrate 1, provided that the major axis of the nano grooves is parallel to a current flowing direction (see FIG. 5C). Also in this case, it is desirable that the average center to center distance of the nano grooves be within the above-described ranges. Furthermore, when nano grooves 2 are discontinuous or irregularly arranged, it is desirable that discontinuous parts be not align in a direction perpendicular to a current flowing direction. This is because if the discontinuous parts are aligned in this direction, the pinning effect of the quantized flux lines decreases in these parts.

The materials which constitute the superconductor layer 3 may be copper oxide-based high temperature superconducting materials having the chemical formula of $LnBa_2Cu_3O_{7+x}$ where, Ln is one or more elements selected from the group consisting of Y element and rare earth elements (elements with atomic number 57 to 71) and $-0.5 < x < 0.2$; copper oxide-based high temperature superconducting materials having the chemical formula of $(Bi_{1-x}Pb_x)_2Sr_2Ca_{n-1}Cu_nO_{4+y}$, where $0 < x < 0.4$, $-0.5 < y < 0.5$ and $n=1$, 2 or 3; or superconducting materials which contain $MgB_2$ as a main component. Superconducting materials which contain $MgB_2$ as a main component in the present invention mean $MgB_2$ which may contain carbon, oxygen or SiC etc. as impurities. These materials are deposited onto a surface of substrate 1 in a c-axis oriented state (the c-axis of these materials is parallel to the normal line of the substrate surface) to form the superconductor layer 3 having a superconducting plane parallel to the substrate plane. The superconductor layer 3 usually has a film thickness in a range of 0.1 μm to 10 μm and preferably in a range of 0.1 μm to 5 μm.

The nano grooves 2 on the substrate 1 can be formed by using mechanical polishing (nano scratching), etching, nano imprint, AFM in processing mode or nano lithography. A preferred method includes nano scratching, nano imprint and AFM in processing mode. For example, nano scratching and nano imprint can be performed by polishing with abrasive grains of diamond etc. in a current flowing direction; or pressing a jig provided with microprotrusions having a desired shape and intervals against the substrate 1 and then moving the jig in a current flowing direction. Alternatively, the nano grooves 2 can be formed by continuously processing the substrate with an AFM in which a high voltage is applied to a probe.

The superconductor layer 3 can be formed by using PLD, evaporation, sputtering, CVD, MBE or MOD process. When the superconductor layer 3 is formed on a surface of the substrate 1 provided with the nano grooves 2, a film which has grown on a flat portion and a film formed on the nano grooves 2 have different crystal orientations. Therefore, it follows that, in an area where the two meets, dislocations and/or crystal grain boundaries are formed. Furthermore, on the nano grooves, there is a possibility that amorphous bodies are formed, or alternatively, crystals having many defects are formed due to the occurrence of compositional variation. As a result, a layer of a nonsuperconductor or a layer of a low critical temperature superconductor is formed on the nano grooves 2. In this specification, the dislocations, crystal grain boundaries, amorphous bodies, nonsuperconductors and low critical temperature superconductors in the superconductor layer 3 are collectively called "crystal defects." These crystal defects will not disappear with the growth of a film and form two-dimensional crystal defects 4 continuing from the nano grooves 2 on the substrate to the surface of the superconductor layer 3. Although it is not always necessary for the two-dimensional crystal defects 4 to be perpendicular to the substrate plane, it is desirable that the two-dimensional crystal defects 4 be present at an angle close to an angle perpendicular to the substrate plane. These two-dimensional crystal defects 4, which have no superconducting properties or have poor superconducting properties, function as two-dimensional pinning centers.

According to this arrangement, the two-dimensional crystal defects 4 are arranged parallel to a current flowing direction and, therefore, they do not impede the flow of a current. When a magnetic field is applied to the superconductor layer 3 perpendicularly thereto, quantized flux lines tend to move toward the two-dimensional crystal defects 4. This is because the Lorentz force acting on the quantized flux lines works in a direction parallel to the substrate plane and orthogonal to the flow of a current. However, two-dimensional pinning centers (two-dimensional crystal defects 4) can work to pin all quantized flux lines, since the two-dimensional crystal defects 4 of the invention pin even quantized flux lines which tend to move by overcoming the interaction in flux line lattices. Compared to dot-like pinning centers such as oxygen deficiency and impurities or one-dimensional pinning centers such as dislocations and columnar defects which are distributed randomly, the two-dimensional pinning centers of the invention, which are regularly arranged in a current flowing direction, have very high pinning efficiency.

The above-described effect is attributed to the issue of dimensionality that pinning with two-dimensional pinning centers is superior in pinning quantized flux lines which have a string shape. Since the two-dimensional pinning center of the invention (two-dimensional crystal defects 4) can pin a larger number of quantized flux lines with a smaller number of pinning centers, and thereby Jc in a magnetic field is improved. Furthermore, the two-dimensional crystal defects 4 work very effectively without interrupting a current path contrary to general grain boundaries which occur randomly in a superconductor layer, since they are parallel to a current flowing direction. Although the two-dimensional crystal defects 4 desirably extend continuously in a current flowing direction, it is not always necessary that they be continuous, and they may be discontinuous as described above. The same effect is obtained even when discontinuous two-dimensional defects are irregularly distributed on a substrate, provided that the major axis direction of discontinuous two-dimensional defects is parallel to a current flowing direction.

The thickness of the two-dimensional crystal defects 4 can be controlled by adjusting the width of the nano grooves 2. Since the two-dimensional crystal defects 4 are dislocations, grain boundaries, amorphous bodies, nonsuperconductors or superconductors having a low critical temperature, they have the pinning interaction of quantized flux lines. Furthermore, the magnitude of the pinning force can be controlled, by controlling the size of the two-dimensional crystal defects 4 to adjust the depth of the pinning potential and the potential steepness. The pinning energy of quantized flux lines per unit length is expressed by $$(\tfrac{1}{2}\mu_0)Bc^2 \times \pi \xi^2$$

where $\mu_0$ is magnetic permeability in a vacuum, $Bc$ is the thermodynamic critical magnetic field of the material for the superconductor layer 3, and $\xi$ is the coherent length. The length of $\xi$ is temperature dependent. Therefore, when the size of an optimum pinning center (two-dimensional crystal defect 4) varies with the working temperature of a superconducting film, an optimum value of the pinning force can be selected by changing the width and average center to center spacing of the nano grooves.

As an alternative to this first embodiment, a superconducting material may be used as a buffer layer. That is, after a thin buffer layer of a superconducting material is first formed on a substrate 1, nano grooves 2 are formed by the same method as described above and a superconductor layer 3 may be formed thereafter. Also in this case, two-dimensional crystal defects 4 are formed in the superconductor layer 3 on the nano grooves 2. It is preferred that usable superconducting materials be the same oxide as the material for the superconductor layer 3 or a boride. For example, when the superconductor layer 3 is formed from $LnBa_2Cu_3O_{7+x}$, a buffer layer may be formed from the same $LnBa_2Cu_3O_{7+x}$ or may be formed from a material in which only Ln is replaced. A buffer layer in an area where no nano groove is formed has the effect of facilitating the epitaxial growth of the superconductor layer 3 in this area, since this buffer layer is a superconducting film of the same type as the superconductor layer 3.

As another alternative to this first embodiment, a superconductor layer 3 may be formed from a plurality of layers and nano grooves may be formed in each of the plurality of layers except a top layer. This alternative embodiment is suitable for introducing two-dimensional crystal defects 4 at a predetermined density in a case where the superconductor layer 3 is thick and the distribution of two-dimensional crystal defects decreases as the formation of the superconductor layer 3 progresses.

Figure 2:
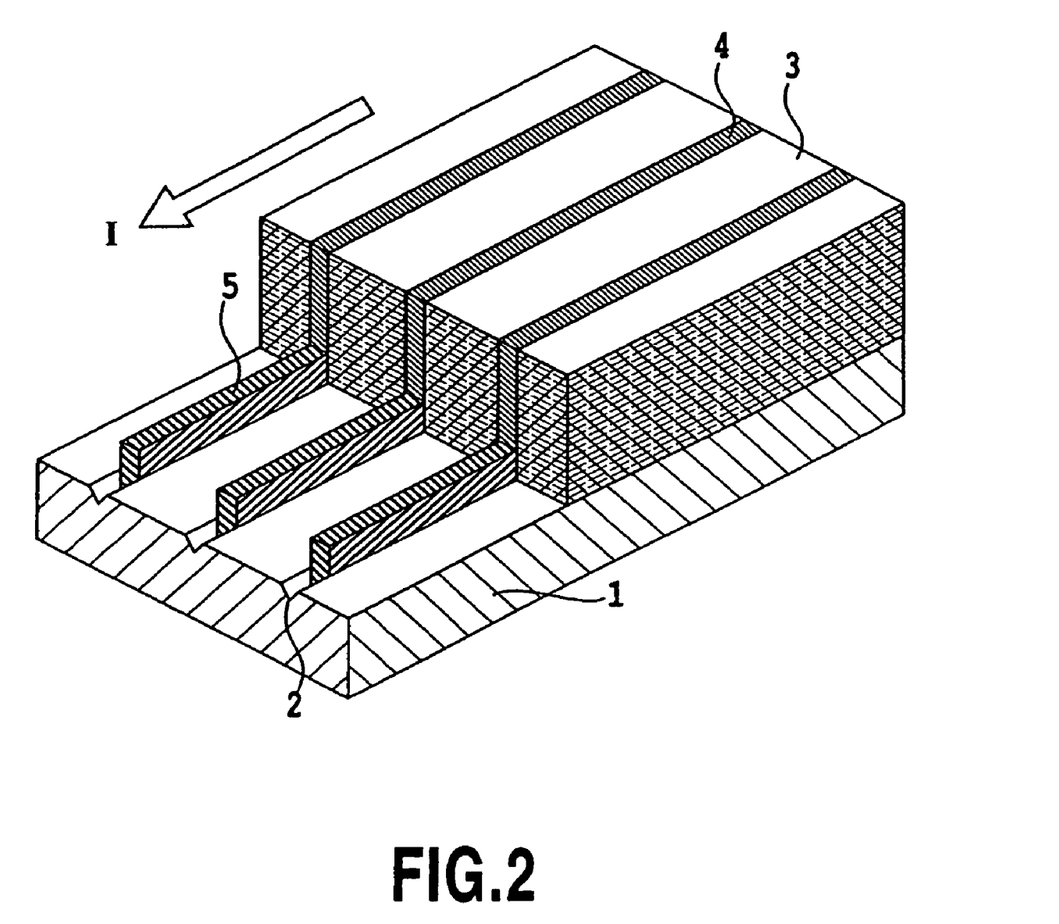
FIG. 2 is a sectional view, in perspective, of a superconducting film of the second embodiment of the invention.

A superconducting film of the second embodiment of the invention is shown in FIG. 2. The superconducting film of FIG. 2 has a substrate 1 in which nano grooves 2 are formed parallel to a current flowing direction on the surface where a superconductor layer 3 is formed, defect inducing parts 5 formed on the nano grooves 2, and the superconductor layer 3 formed on the substrate 1 and the defect inducing parts 5, and two-dimensional crystal defects 4 are introduced in the superconductor layer 3 on the defect inducing parts 5. The two-dimensional crystal defects 4 function as two-dimensional pinning centers. The substrate 1, the nano grooves 2 and the superconductor layer 3 are the same as in the first embodiment.

The defect inducing parts 5 are formed from plate-like crystals or series of island-like crystals. The nano grooves 2 function as preferential nucleation sites, and thereby, the defect inducing parts 5 are formed on the nano grooves 2. Usable materials include, for example, metals such as Ag and Pt (it is desirable that the metals have a high melting point); intermetallic compounds such as AgY and $Pt_3Y$; nitrides such as GdN and YN; and oxides such as $Y_2O_3$ and $CeO_2$. Although in the present invention, it is preferred that the defect inducing parts 5 be formed from a material different from that of the substrate 1, the defect inducing parts 5 may be formed from a material which is of the same kind as the substrate 1 but has a different crystal orientation. The defect inducing parts 5 can be formed by depositing the above-described materials on the substrate 1 by a method selected from PLD, evaporation, sputtering CVD and MBE. In this case, such materials nucleate and grow on the nano grooves 2, since the nano grooves 2 are preferential nucleation sites compared to the flat substrate 1. By adjusting the material supply time, film forming time and film forming temperature, plate-like crystals or series of island-like crystals of an appropriate size can be formed on the nano grooves 2. Whether crystals grow in a plate form or in an island form is adjusted by appropriately selecting the wettability of the substrate 1 with the above-described materials.

Unlike nano dots which are formed randomly on a substrate, the defect inducing parts 5 are regularly arranged so that their shape becomes parallel to a current flowing direction, and in this respect the invention is greatly different from prior art. Since the smoothness of the surfaces of the defect inducing parts 5, and/or the deposition rate, crystal orientation, etc. of a superconducting material on the surfaces of the defect inducing parts 5 are different from those of the substrate 1, the two-dimensional crystal defects 4 are formed in the superconductor layer 3 formed on the defect inducing parts 5. These two-dimensional crystal defects 4 function as two-dimensional pinning centers in the same manner as in the first embodiment, they give an excellent pinning efficiency.

Also in this constitution, even quantized flux lines which tend to move by overcoming the interaction between flux line lattices can be pinned, since the two-dimensional crystal defects 4 are arranged parallel to a current flowing direction.

Therefore, two-dimensional pinning centers can be obtained having a very high pinning efficiency.

The thickness of the two-dimensional crystal defects 4 can be controlled by adjusting the width of the defect inducing parts 5 (i.e., the width of the nano grooves 2). Furthermore, the magnitude of the pinning force can be controlled, by controlling the size of the two-dimensional crystal defects 4 to adjust the depth of the pinning potential and the potential steepness. When the size of an optimum pinning center (two-dimensional crystal defect 4) varies with the working temperature of a superconducting film, an optimum value of the pinning force can be selected by changing the width and average center to center gap of the nano grooves.

As an alternative to this second embodiment, in the same manner as in the first embodiment, a superconducting material may be used as a buffer layer. Also in this case, two-dimensional crystal defects 4 are formed on defect inducing parts 5. Usable superconducting materials are the same as in the first embodiment, and a buffer layer in an area where no defect inducing part 5 is formed has the effect of facilitating the epitaxial growth of the superconductor layer 3 in this portion, since this buffer layer is a superconducting film of the same type as the superconductor layer 3.

As another alternative to this second embodiment, a superconductor layer 3 may be formed from a plurality of layers and nano grooves may be formed in each of the plurality of layers except a top layer. This alternative embodiment is suitable for introducing two-dimensional crystal defects 4 of a predetermined density in a case where the superconductor layer 3 is thick and the distribution of two-dimensional crystal defects decreases as the formation of the superconductor layer 3 progresses.

Figure 3:
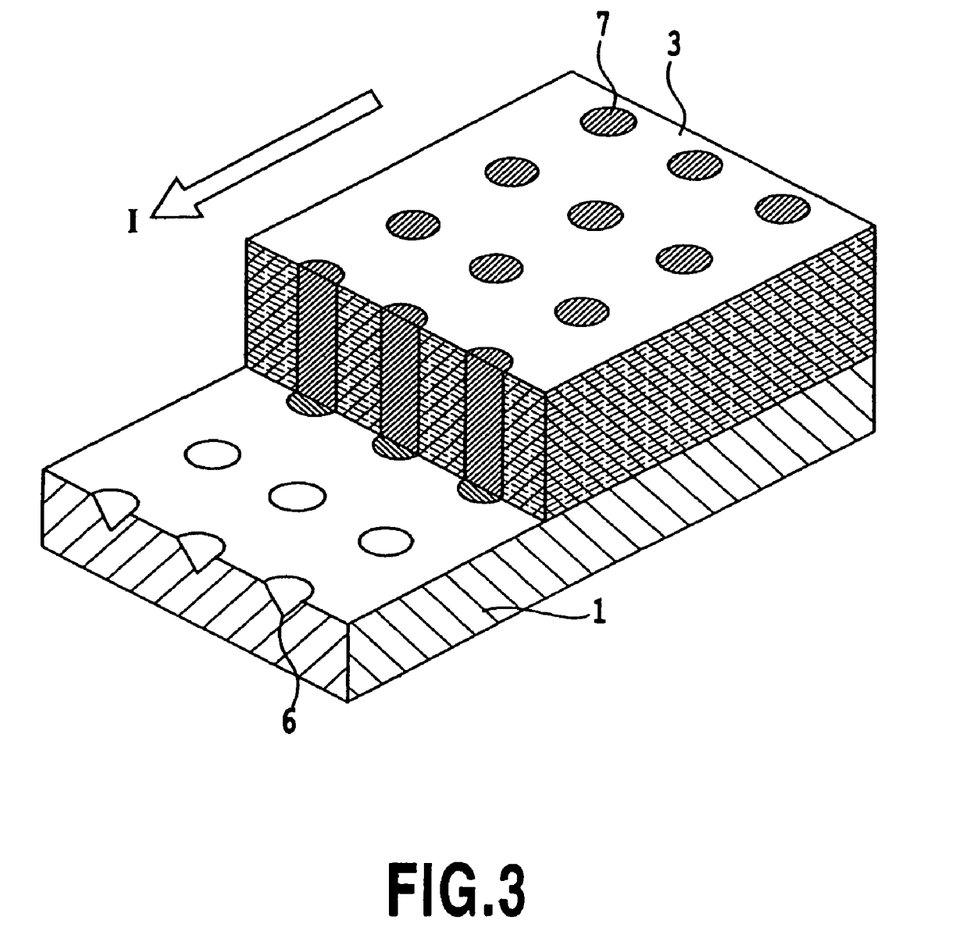
FIG. 3 is a sectional view, in perspective, of a superconducting film of the third embodiment of the invention.

A superconducting film of the third embodiment of the invention is shown in FIG. 3. The superconducting film of FIG. 3 has a substrate 1 and a superconductor layer 3 formed on the substrate 1. Rows of nano holes 6 are formed parallel to a current flowing direction on a substrate surface where the superconductor layer 3 is formed, and one-dimensional crystal defects 7 are introduced in the superconductor layer on the nano holes 6. The one-dimensional crystal defects 7 function as pinning centers. The substrate 1 and the superconductor layer 3 are the same as in the first embodiment.

The nano holes 6 are a plurality of non-through holes which are formed on the substrate and are formed on the substrate 1 to form rows parallel to a current flowing direction. "Rows of the nano holes 6" means that the spacing between the adjacent nano holes 6 in a direction parallel to a current flowing direction is smaller than the lattice constant of quantized flux line lattice $a_f$ in the superconductor layer 3. The spacing between the adjacent nano holes 6 in a direction parallel to a current flowing direction is usually not more than 250 nm, and preferably in the range of 20 nm to 150 nm, depending on a magnetic field B applied to the superconductor layer 3. Rows of the one-dimensional crystal defects 7 formed by the rows of nano holes 6 having such a spacing are dense relative to quantized flux lines and have the same effect as two-dimensional pinning centers. That is, quantized flux lines can be effectively prevented from moving through the rows of the one-dimensional crystal defects 7.

It is desirable that the diameter of the nano holes 6 be larger than the diameter of the quantized flux lines constituting the superconductor layer 3 (twice the coherent length $\xi$ of a superconducting material). It is desirable that the nano holes have a diameter of usually not more than 100 nm, and preferably in the range of 5 nm to 50 nm, depending on the material for the superconductor layer 3. The average center to center distance between the rows of the nano holes 6 is usually not more than 500 nm, preferably 15 to 300 nm, and more preferably 20 nm to 200 nm, depending on an applied magnetic field B. When the rows of the nano holes 6 have widths, depths and center to center distances in the above-described ranges, the quantized flux lines in the superconductor layer 3 can be pinned efficiently.

Figure 6A:
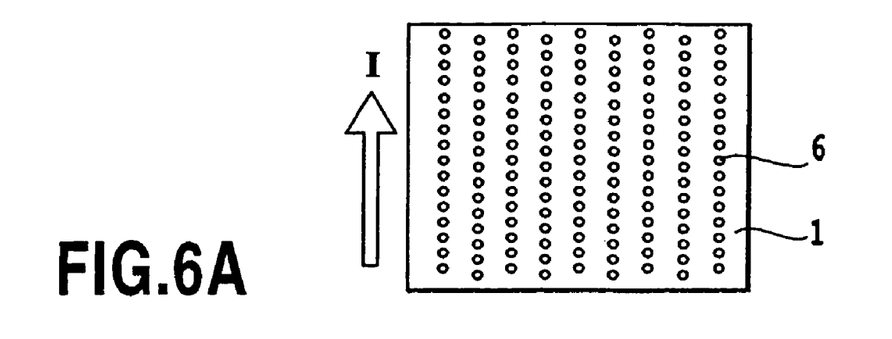
FIG. 6A is a schematic top view of an example of the arrangement of nano holes in a superconducting film of the invention in which rows of the nano holes are continuous.
Figure 6B:
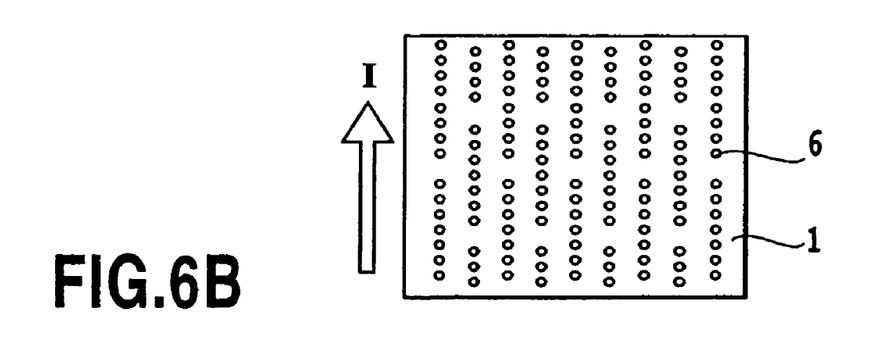
FIG. 6B is a schematic top view of an example of the arrangement of nano holes in a superconducting film of the invention in which rows of the nano holes are discontinuous.
Figure 6C:
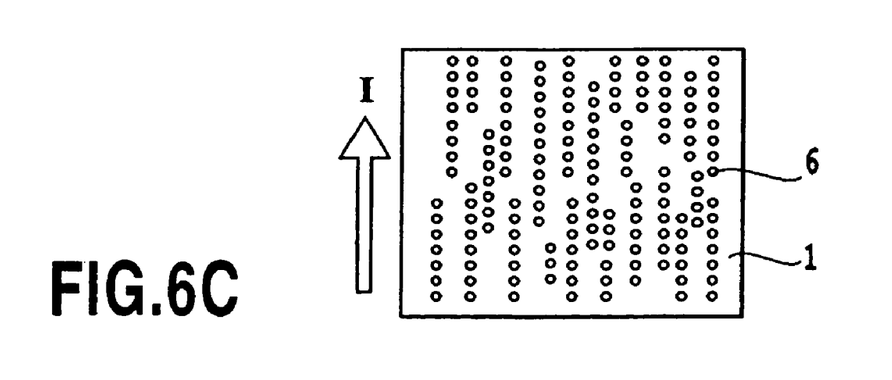
FIG. 6C is a schematic top view of an example of the arrangement of nano holes in a superconducting film of the invention in which rows of the nano holes are irregularly arranged.

Each of the rows of the nano holes 6 may be continuous in the current flowing direction of the superconducting film (see FIG. 6A) or may be an array of discontinuous rows (see FIG. 6B). It is desirable that the distance between two rows of nano holes in a discontinuous part in a current flowing direction be smaller than the lattice constant of quantized flux line lattice $a_f$ in the superconductor layer 3. This distance is usually not more than 500 nm, preferably 15 nm to 300 nm, and more preferably 20 nm to 200 nm, depending on a magnetic field B applied to the superconductor layer 3. Alternatively, a plurality of rows of nano holes 6 may be irregularly arranged on the substrate 1, provided that the major axis of the rows of nano holes be parallel to a current flowing direction (see FIG. 6C). Also in this case, it is desirable that the distance between adjacent rows of nano holes 6 in a current flowing direction and the average center to center distance in a direction parallel to a current flowing direction be within the above-described ranges. In the cases of FIG. 6B and FIG. 6C, it is desirable that discontinuous parts be not aligned in a direction perpendicular to a current flowing direction. This is because if discontinuous parts are aligned in this direction, the pinning effect of the quantized flux lines decreases in these parts. In the cases of FIG. 6A to FIG. 6C, in two rows of nano holes which are adjacent in a direction orthogonal to a current flowing direction, the nano holes may be arranged in a "mutually nested" state (i.e. positions of nano holes of one row correspond to positions of spacing of another row and vice versa, the state of FIG. 6A and FIG. 6B), or the nano holes may be aligned in a direction orthogonal to a current flowing direction.

The nano holes 6 on the substrate 1 can be formed by using mechanical polishing (nano scratching), etching, nano imprint, AFM in processing mode or nano lithography. A preferred method includes nano imprint and AFM in processing mode. For example, nano imprint can be performed by pressing a jig provided with microprotrusions having a desired shape and intervals against the substrate 1. Alternatively, the nano holes 6 can be formed by intermittently processing the substrate using an AFM in which a high voltage is applied to a probe.

When the superconducting layer 3 is formed on the surface of the substrate where the nano holes 6 are provided, one-dimensional "crystal defects" are formed on the nano holes 6 in the same manner as in the case where the nano grooves 2 are provided. The crystal defects 7 on the nano holes 6 are the same as the "crystal defects" of the first embodiment, with the exception that the crystal defects 7 on the nano holes 6 are one-dimensional in shape, rather than two-dimensional. The crystal defects on the nano holes 6 will not disappear with the growth of a film and form one-dimensional crystal defects 7 continuing from the nano holes 6 on the substrate to the surface of the superconductor layer 3. These one-dimensional crystal defects 7, which have no superconducting properties or have poor superconducting properties, become one-dimensional pinning centers. Although it is not always necessary for the one-dimensional crystal defects 7 to be perpendicular to the substrate plane, it is desirable that the one-dimensional crystal defects 7 be present at an angle close to an angle perpendicular to the substrate plane.

According to the arrangement of this embodiment, the rows of one-dimensional crystal defects 7 will not interrupt a current, since they are arranged parallel to a current flowing direction. When a magnetic field is applied to the superconductor layer 3 perpendicularly thereto, the quantized flux lines tend to move toward the sides of the rows of one-dimensional crystal defects 7. This is because the Lorentz force is in a direction parallel to the substrate surface and orthogonal to the flow of a current. However, if the rows of one-dimensional crystal defects 7 of the invention are dense, the rows of one-dimensional crystal defects 7 can pin even quantized flux lines which tend to move by overcoming the interaction between flux line lattices, and hence the rows of one-dimensional crystal defects 7 can work for the pinning of all quantized flux lines. The structure of the pinning centers of the invention has very high pinning efficiency.

The diameter of the one-dimensional crystal defects 7 can be controlled by adjusting the diameter of the nano holes 6. Since the one-dimensional crystal defects 7 are dislocations, grain boundaries, amorphous bodies, nonsuperconductors or superconductors having a low critical temperature, they have the pinning interaction of quantized flux lines. Furthermore, the magnitude of the pinning force can be controlled, by controlling the size of the nano holes 6 to adjust the depth of the pinning potential and the potential steepness. When the size of an optimum pinning center (one-dimensional crystal defect 7) varies with the working temperature of a superconducting film, an optimum value of the pinning force can be selected by changing the diameter of nano holes, the spacing between the nano holes in a current flowing direction, and the average center to center spacing of the rows of nano holes in a direction orthogonal to a current flowing direction.

As an alternative to this third embodiment, a superconducting material may be used as a buffer layer. That is, after a buffer layer of a superconducting material is first formed thin on a substrate 1, nano holes 6 are formed by the same method as described above and a superconductor layer 3 may be formed thereafter. Also in this case, one-dimensional crystal defects 7 are formed in the superconductor layer 3 on the nano holes 6. It is preferred that usable superconducting materials be the same oxide as the material for the superconductor layer 3 or a boride. For example, when the superconductor layer 3 is formed from $LnBa_2Cu_3O_{7+x}$, a buffer layer may be formed from the same $LnBa_2Cu_3O_{7+x}$ or may be formed from a material in which only Ln is replaced. A buffer layer in an area where no nano hole is formed has the effect of facilitating the epitaxial growth of the superconductor layer 3 in this portion, since this buffer layer is a superconducting film of the same type as the superconductor layer 3.

As another alternative to this third embodiment, a superconductor layer 3 may be formed from a plurality of layers and nano holes may be formed in each of the plurality of layers except a top layer. This alternative embodiment is suitable for introducing one-dimensional crystal defects 7 at a predetermined density in a case where the superconductor layer 3 is thick and the distribution of one-dimensional crystal defects decreases as the formation of the superconductor layer 3 progresses.

Figure 4:
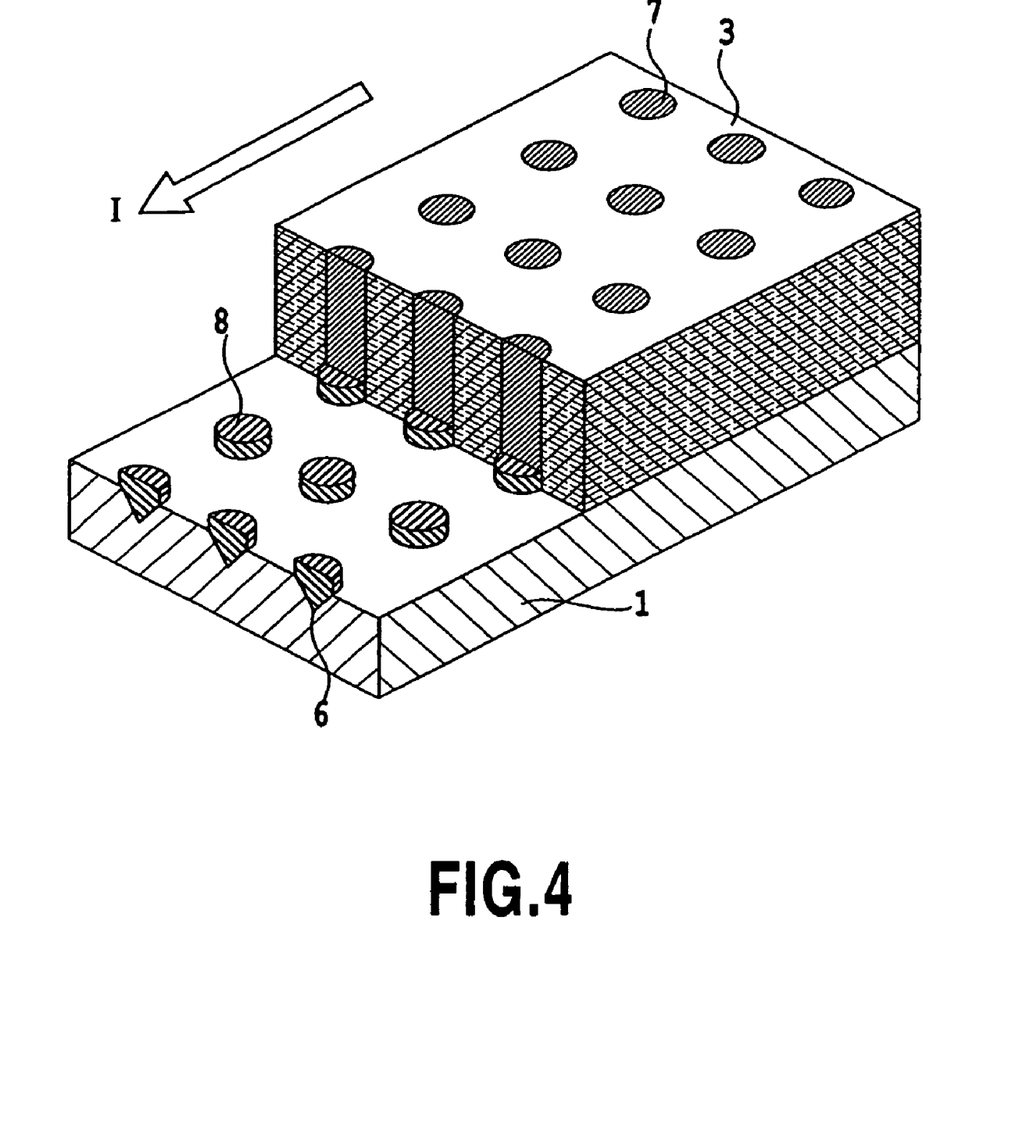
FIG. 4 is a sectional view, in perspective, of a superconducting film of the fourth embodiment of the invention.

A superconducting film of the fourth embodiment of the invention is shown in FIG. 4. The superconducting film of FIG. 4 has a substrate 1 in which rows of nano holes 6 are formed parallel to a current flowing direction on the surface where a superconductor layer 3 is formed, defect inducing parts 8 formed on the rows of the nano holes 6, and the superconductor layer 3 formed on the substrate 1 and the defect inducing parts 8, and the one-dimensional crystal defect 7 is introduced in the superconductor layer on the defect inducing parts 8. The one-dimensional crystal defects 7 function as pinning centers. The substrate 1, the nano holes 6 and the superconductor layer 3 are the same as in the third embodiment.

The defect inducing parts 8 are the same as the defect inducing parts 5 of the second embodiment, with the exception that the shape is island-like crystals. Usable materials include, for example, metals such as Ag and Pt (it is desirable that the metals have a high melting point); intermetallic compounds such as AgY and $Pt_3Y$, nitrides such as GdN and YN; and oxides such as $RE_2O_3$ (RE: rare earth element) and $CeO_2$. Although in the present invention, it is preferred that the defect inducing parts 8 be formed from a material different from that of the substrate 1, the defect inducing parts 8 may be formed from a material which is of the same kind as the substrate 1 but has a different crystal orientation. The defect inducing parts 8 can be formed by depositing the above-described materials on the substrate 1 by a method selected from PLD, evaporation, sputtering CVD and MBE. In this case, the nano holes 6 are preferential nucleation sites compared to the flat substrate 1 and, therefore, the above-described materials nucleate and grow on the nano holes 6. By adjusting the material supply amount, film forming time and film forming temperature, it is possible to form the defect inducing parts 8 consisting of island-like crystals of an appropriate size on the nano holes 6.

Unlike nano dots which are formed randomly on a substrate, the rows of defect inducing parts 8 are regularly arranged so as to be parallel to a current flowing direction, and in this respect the invention is greatly different from prior art. Since the smoothness of the surfaces of the defect inducing parts 8, and/or the deposition rate, crystal orientation, etc. of a superconducting material on the surfaces of the defect inducing parts 8 are different from those of the substrate 1, the one-dimensional crystal defects 7 are formed in the superconductor layer 3 formed on the defect inducing parts 8. Rows of these one-dimensional crystal defects 7 function as one-dimensional pinning centers in the same manner as in the third embodiment. Because the rows of one-dimensional crystal defects 7 are arranged parallel to a current flowing direction, they will not interrupt a current. Therefore, the rows of one-dimensional crystal defects 7 of this embodiment can provide one-dimensional pinning centers having an excellent pinning efficiency.

The diameter of the one-dimensional crystal defects 7 can be controlled, by adjusting the diameter of the defect inducing parts 8 (i.e., the width of the nano holes 6). Furthermore, the magnitude of the pinning force can be controlled by controlling the size of the one-dimensional crystal defects 7 to adjust the depth of the pinning potential and the potential steepness. When the size of an optimum pinning center (one-dimensional crystal defect 7) varies with the working temperature of a superconducting film, an optimum value of the pinning force can be selected by changing the diameter of the nano holes 6 and the average center to center spacing of the rows of nano holes 6.

As an alternative to this fourth embodiment, a superconducting material may be used as a buffer layer in the same manner as in the third embodiment. Also in this case, one-dimensional crystal defects 7 are formed on the defect inducing parts 8. It is preferred that usable superconducting materials be the same oxide as the material for the superconductor layer 3 or a boride. For example, when the superconductor layer 3 is formed from $LnBa_2Cu_3O_{7+x}$, a buffer layer may be formed from the same $LnBa_2Cu_3O_{7+x}$ or may be formed from a material in which only Ln is replaced. A buffer layer in an area where no defect inducing part is formed has the effect of facilitating the epitaxial growth of the superconductor layer 3 in this portion, since this buffer layer is a superconducting film of the same type as the superconductor layer 3.

As another alternative to this fourth embodiment, a superconductor layer 3 may be formed from a plurality of layers and rows of nano holes 6 may be formed in each of the plurality of layers except a top layer. This alternative embodiment is suitable for introducing one-dimensional crystal defects 7 of a prescribed density in a case where the superconductor layer 3 is thick and the distribution of one-dimensional crystal defects 7 decreases as the formation of the superconductor layer 3 progresses.

EXAMPLE 1

First, nano grooves were formed on a single-crystal substrate. An $SrTiO_3$ substrate 3 mm wide×10 mm long×0.5 mm thick, the (100) plane of which was mirror-like polished, was prepared as the single-crystal substrate. Subsequently, nano grooves were formed in a region of 60 μm×60 μm in the central part of this substrate surface by utilizing AFM in processing mode. With the width and depth of the nano grooves set at 30 nm respectively and the length of the nano grooves at 60 μm, 330 nano grooves were formed in the above-described region with equal spacing such that the nano grooves become parallel to the longitudinal direction of the substrate. The average spacing of the centers of the nano grooves was 150 nm. With the substrate fixed on a heater provided within a vacuum chamber, a thin film of $YBa_2Cu_3O_{7-x}$ (YBCO) was formed on the substrate by the excimer pulsed laser deposition (PLD) method and a superconducting film (I-1) was obtained. At this time, a flat $SrTiO_3$ substrate 3 mm wide×10 mm long×0.5 mm thick, in which no nano groove was formed, was fixed beside the substrate on which nano grooves were formed and a superconducting film (C-1) was obtained. The superconducting film (I-1) is an example of the invention and the superconducting film (C-1) is a comparative example outside the scope of the invention. A target of sintered YBCO of a stoichiometric composition was used in the above PLD method. The substrate temperature during film deposition was 780° C. The partial oxygen pressure was 200 mTorr, and a sufficient volume of oxygen was introduced in the film cooling process. The film thickness of the obtained YBCO was 0.5 μm.

The crystal orientation of the two films (I-1) and (C-1) was evaluated by X-ray diffraction and it was ascertained that both are highly c-axis oriented films. Furthermore, when the in-plane crystal orientation of the films was investigated by φ scan, it was found that both were highly in-plane oriented. From these investigation, it could be ascertained that the two films are biaxially oriented to the same extent.

In order to investigate the superconducting properties of the obtained films, a bridge pattern was formed on the YBCO films by lithography. The width of the bridge was 40 μm and its length was 40 μm. At this time, in the superconducting film (I-1), the bridge pattern was formed on the above-described region 60 μm×60 μm where the nano grooves were formed. Consequently, when energized, a current flows parallel to the nano grooves. For the patterned two samples, the electrical properties were evaluated by the four terminal method. The critical temperature Tc of the samples was 90 K for the superconducting film (I-1) with nano grooves and 91 K for the superconducting film (C-1) without a nano groove, as determined from temperature variations in resistivity. Under a zero magnetic field, the critical current density Jc of the superconducting film (I-1) at 77 K was 5,000,000 A/cm², and that of the superconducting film (C-1) was 4,500,000 A/cm². Furthermore, under a magnetic field of 1 T (tesla) parallel to the c-axis (perpendicular to the substrate plane), Jc of the superconducting film (I-1) at a temperature of 77 K was 1,100,000 A/cm², and that of the superconducting film (C-1) was 580,000 A/cm².

EXAMPLE 2

Nano grooves were formed on an $SrTiO_3$ substrate in the same manner as in Example 1. Next, the substrate on which nano grooves had been formed was fixed on a heater within a vacuum heater for PLD, and defect inducing parts were formed on the nano grooves by the PLD method. $Y_2O_3$ was used as the material for the defect inducing parts. A $Y_2O_3$ sintered compact target was ablated using 30 pulses of an excimer laser, and $Y_2O_3$ was deposited on the $SrTiO_3$ substrate. At this time, the substrate temperature was 700° C. and the partial oxygen pressure was $10^{-5}$ Torr ($1.33×10^{-3}$ Pa). Under these conditions, $Y_2O_3$ deposited only on the nano grooves to form the defect inducing parts. Then, the temperature was lowered to room temperature and in the same manner as in Example 1, an $SrTiO_3$ substrate without a nano groove was attached on the heater, beside the sample with nano grooves and defect inducing parts. Then, in the same manner as in Example 1, YBCO films were formed by the PLD method using the sintered YBCO target, to give superconducting films (I-2) and (C-2). The superconducting film (I-2) is an example of the invention having defect inducing parts, and the superconducting film (C-2) is a comparative example outside the scope of the invention. The film deposition conditions were the same as in Example 1.

According to an X-ray diffraction analysis, the two samples equally showed a high c-axis orientation and a high in-plane orientation. Subsequently, in order to investigate the superconducting properties of the obtained films, a bridge pattern was formed on the YBCO films by lithography. The width of the bridge was 40 μm and its length was 40 μm. At this time, in the superconducting film (I-2), the bridge pattern was formed on the above-described region 60 μm×60 μm where the nano grooves were formed. The critical temperature Tc of the two patterned samples was measured 89.5 K for the superconducting film (I-2) and 90.5 K for the superconducting film (C-2). Under a zero magnetic field, the critical current density Jc at 77 K of the superconducting film (I-2) was 5,200,000 A/cm², and that of the superconducting film (C-2) was 4,300,000 A/cm². Furthermore, under a magnetic field of 1 T parallel to the c-axis, Jc of the superconducting film (I-2) at a temperature of 77 K was 1,300,000 A/cm², and that of the superconducting film (C-2) was 550,000 A/cm².

EXAMPLE 3

First, nano holes were formed on a single-crystal substrate. An $SrTiO_3$ substrate 3 mm wide×10 mm long×0.5 mm thick, the (100) plane of which was mirror-like polished, was prepared as the Single-crystal substrate. Rows of nano holes were formed in a region of 60 μm×60 μm in the central part of this substrate surface by use of electron beam lithography. The width and depth of the nano holes were 40 nm and 20 nm, respectively. The rows of nano holes were arranged so as to be parallel to the length direction of the substrate and so that the length of the rows became 60 μm. The spacing between the nano holes in the longitudinal direction of the substrate was 100 nm, and 330 rows of nano holes were formed in the above-described region 60 μm×60 μm with equal spacing. The average spacing of the centers of the nano hole rows was 150 nm. With this substrate fixed on a heater provided within a vacuum chamber, a thin film of $YBa_2Cu_3O_{7-x}$ (YBCO) was formed on the substrate by the excimer pulse laser deposition (PLD) method and a superconducting film (I-3) was obtained. At this time; a flat SrTiO$_3$ substrate 3 mm wide×10 mm long×0.5 mm thick, in which no nano hole was formed, was fixed beside the substrate on which nano holes were formed and a superconducting film (C-3) was obtained. The film deposition conditions were the same as in Example 1.

According to an X-ray diffraction analysis, the two samples equally showed a high c-axis orientation and a high in-plane orientation. Subsequently, in order to investigate the superconducting properties of the obtained films, a bridge pattern was formed on the YBCO films by lithography. The width of the bridge was 40 μm and its length was 40 μm. At this time, in the superconducting film (I-3), the bridge pattern was formed on the above-described region 60 μm×60 μm where the rows of nano holes were formed. The critical temperature Tc of the two patterned samples was measured 90.5 K for the superconducting film (I-3) and 91 K for the superconducting film (C-3). Under a zero magnetic field, the critical current density Jc of the superconducting film (I-3) at 77 K was 5,100,000 A/cm$^2$, and that of the superconducting film (C-3) was 4,000,000 A/cm$^2$. Furthermore, under a magnetic field of 1 T parallel to the c-axis, Jc of the superconducting film (I-3) at a temperature of 77 K was 1,000,000 A/cm$^2$, and that of the superconducting film (C-3) was 450,000 A/cm$^2$.

EXAMPLE 4

Nano holes were formed on an SrTiO$_3$ substrate in the same manner as in Example 3. Next, the substrate on which nano holes had been formed was fixed on a heater within a vacuum heater for PLD, and defect inducing parts were formed on the nano holes by the PLD method. Y$_2$O$_3$ was used as the material for the defect inducing parts. A Y$_2$O$_3$ sintered compact target was ablated using 15 pulses of an excimer laser and Y$_2$O$_3$ was deposited on the SrTiO$_3$ substrate. At this time, the substrate temperature was 700° C. and the partial oxygen pressure was $10^{-5}$ Torr ($1.33\times10^{-3}$ Pa). Under these conditions, Y$_2$O$_3$ deposited only on the nano holes to form the defect inducing parts. Then, the temperature was lowered to room temperature and in the same manner as in Example 3, a flat SrTiO$_3$ substrate without a nano hole was attached on the heater, beside the sample with defect inducing parts. Then, in the same manner as in Example 3, YBCO films were formed by the PLD method using the sintered YBCO target, and superconducting films (I-4) and (C-4) were obtained. The superconducting film (I-4) is an example of the invention having defect inducing parts and the superconducting film (C-4) is a comparative example outside the scope of the invention.

According to an X-ray diffraction analysis, the two samples equally showed a high c-axis orientation and a high in-plane orientation. Subsequently, in order to investigate the superconducting properties of the obtained films, a bridge pattern was formed on the YBCO films by lithography. The width of the bridge was 40 μm and its length was 40 μm. At this time, in the superconducting film (I-4), the bridge pattern was formed on the above-described region 60 μm×60 μm where the defect inducing parts (nano holes) were formed. The critical temperature Tc of the two patterned samples was measured 90 K for the superconducting film (I-4) and 90.5 K for the superconducting film (C-4). Under a zero magnetic field, the critical current density Jc of the superconducting film (I-4) at 77 K was 4,800,000 A/cm$^2$, and that of the superconducting film (C-4) was 4,500,000 A/cm$^2$. Furthermore, under a magnetic field of 1 T parallel to the c-axis, Jc of the superconducting film (I-4) at a temperature of 77 K was 1,200,000 A/cm$^2$, and that of the superconducting film (C-4) was 600,000 A/cm$^2$.

TABLE 1

Evaluation of superconducting properties of superconducting films

| Super-conducting film | Critical temperature Tc(K) | Critical current density Jc ($\times 10^4$ A/cm$^2$) | |
|---|---|---|---|
| | | (@77 K, 0T) | (@77 K, 1 T, B//c-axis) |
| (I-1) | 90 | 500 | 110 |
| (C-1) | 91 | 450 | 58 |
| (I-2) | 89.5 | 520 | 130 |
| (C-2) | 90.5 | 430 | 55 |
| (I-3) | 90.5 | 510 | 100 |
| (C-3) | 91 | 400 | 45 |
| (I-4) | 90 | 480 | 120 |
| (C-4) | 90.5 | 450 | 60 |

As described above, the superconducting films of the invention showed critical temperatures Tc equivalent to those of the conventional superconducting films, and provided critical current densities equal to or more than those of the conventional films under a zero magnetic field. Furthermore, in a magnetic field of 1 T, the superconducting films of the invention showed critical current densities much higher than those of the conventional superconducting films. Therefore, the superconducting films of the invention can allow larger currents to flow when they operate under the influence of a magnetic field, and are suitable not only as devices to operate in such an environment, but also for applications such as cables, magnets, shields, current limiters, microwave devices, intermediate devices of these articles.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A superconducting film comprising:
   a substrate having a surface;
   a superconductor layer formed on said surface of the substrate;
   nano grooves formed in said substrate, the nano grooves having a width of not more than 100 nm and defining a current flowing direction when current flows through the superconductor layer, wherein the current flow direction is parallel to the longitudinal direction of the nano grooves; and
   rows of two-dimensional crystal defects in the superconductor layer, the two-dimensional crystal defects being on the nano grooves.

2. The superconducting film as claimed in claim 1, wherein each of said two-dimensional crystal defects is a two-dimensional crystal defect which is continuous in a current flowing direction.

3. The superconducting film as claimed in claim 1, wherein each of said two-dimensional crystal defects is a two-dimensional crystal defect which is an array of discontinuous two-dimensional crystal defects.

4. The superconducting film as claimed in claim 1, wherein said two-dimensional crystal defects are irregularly distributed on the substrate.

5. The superconducting film as claimed in claim 1, wherein said two-dimensional crystal defects are crystal grain boundaries, dislocation arrays, amorphous bodies formed from elements constituting said superconductor layer, nonsuperconductors or low critical temperature superconductors.

6. The superconducting film as claimed in claim 1, wherein said nano grooves have a depth of not more than 100 nm and that the average center to center distance of adjacent nano grooves in a direction perpendicular to a current flowing direction is not more than 500 nm.

7. The superconducting film as claimed in claim 1, wherein said substrate is a substrate of an oxide having a perovskite type crystal structure, a rock-salt type crystal structure, a spinel type crystal structure, an yttrium stabilized zirconia type structure, a fluorite type crystal structure, a rare earth C type crystal structure, or a pyrochlore type crystal structure; or an oxide substrate, a nitride substrate, a semiconductor substrate, a nickel-based alloy substrate, a copper-based alloy substrate or an iron-based alloy substrate on the surface of which a buffer layer is formed from said oxide or boride.

8. The superconducting film as claimed in claim 1, wherein said superconductor layer is formed from a superconducting material selected from the group consisting of copper oxide-based high temperature superconducting materials having the chemical formula $LnBa_2Cu_3O_{7+x}$, where Ln is one or more elements selected from the group consisting of Y element and rare earth elements and $-0.5<x<0.2$; copper oxide-based high temperature superconducting materials having the chemical formula $(Bi_{1-x}Pb_x)_2Sr_2Ca_{n-1}Cu_nO_{2n+4+y}$, where $0<x<0.4$, $-0.5<y<0.5$ and n=1, 2 or 3; and superconducting materials which contain the chemical formula $MgB_2$ as a main component.

9. The superconducting film as claimed in claim 1, wherein said superconductor layer is formed from a plurality of layers, and nano grooves are formed in each of said plurality of layers except a top layer.

10. A superconducting film comprising:
a substrate having a surface;
a superconductor layer formed on said surface of the substrate;
rows of nano holes formed in said substrate, the nano holes having a defined diameter, wherein the nano holes define a current flowing direction when current flow through the superconductor layer; and
rows of one-dimensional crystal defects in the superconductor layer, the one-dimensional crystal defects being on the nano holes.

11. The superconducting film as claimed in claim 10, wherein each of said rows of one-dimensional crystal defects is a row of one-dimensional crystal defects which is continuous in a current flowing direction.

12. The superconducting film as claimed in claim 10, wherein each of said rows of one-dimensional crystal defects is an array of discontinuous rows of one-dimensional crystal defects.

13. The superconducting film as claimed in claim 10, wherein said rows of one-dimensional crystal defects are irregularly distributed on the substrate.

14. The superconducting film as claimed in claim 10, wherein said one-dimensional crystal defects are crystal grain boundaries, dislocation arrays, amorphous bodies formed from elements constituting said superconductor layer, nonsuperconductors or low critical temperature superconductors.

15. The superconducting film as claimed in claim 10, wherein said nano holes have a diameter of not more than 100 nm and that the average center to center distance of adjacent rows of nano holes in a direction perpendicular to a current flowing direction is not more than 500 nm.

16. The superconducting film as claimed in claim 10, wherein said substrate is a substrate of an oxide having a perovskite type crystal structure, a rock-salt type crystal structure, a spinel type crystal structure, an yttrium stabilized zirconia type crystal structure, a fluorite type crystal structure, a rare earth C type crystal structure, or a pyrochlore type crystal structure; or an oxide substrate, a nitride substrate, a semiconductor substrate, a nickel-based alloy substrate, a copper-based alloy substrate or an iron-based alloy substrate on the surface of which a buffer layer is formed from said oxide or boride.

17. The superconducting film as claimed in claim 10, wherein said superconductor layer is formed from a superconducting material selected from the group consisting of copper oxide-based high temperature superconducting materials having a chemical formula of $LnBa_2Cu_3O_{7+x}$, where Ln is one or more elements selected from the group consisting of Y element and rare earth elements and $-0.5<x<0.2$; copper oxide-based high temperature superconducting materials having a chemical formula of $(Bi_{1-x}Pb_x)_2Sr_2Ca_{n-1}Cu_nO_{2n+4+y}$, where $0<x<0.4$, $-0.5<y<0.5$ and n=1, 2 or 3; and superconducting materials which contain $MgB_2$ as a main component.

18. The superconducting film as claimed in claim 10, wherein said superconductor layer is formed from a plurality of layers and rows of nano holes are formed in each of said plurality of layers except a top layer.

* * * * *